March 3, 1959 S. K. TALLY ET AL 2,876,393

PRINTED CIRCUIT BASEBOARD

Filed May 15, 1956 2 Sheets-Sheet 1

Sidney K. Tally
Victor F. Dahlgren
*INVENTOR.*

Sidney K. Tally
Victor F. Dahlgren
*INVENTOR.*

2,876,393

PRINTED CIRCUIT BASEBOARD

Sidney K. Tally, Nashua, and Victor F. Dahlgren, West Windham, N. H., assignors, by mesne assignments, to Sanders Associates, Inc., Nashua, N. H., a corporation of Delaware Application May 15, 1956, Serial No. 585,075

13 Claims. (Cl. 317—101)

The present invention is directed to printed circuit baseboards and particularly to baseboards formed from a plurality of layers of thermoplastic insulating supports with prearranged wiring circuits on each of the layers.

Conventional printed circuit baseboards with conductors formed on one or both sides of the board by etching, electrodeposition, silver screening or any of a number of well-known processes are now widely utilized. However, the trend toward miniaturization and lightweight of electronic devices has greatly increased the difficulty of providing baseboards which are sufficiently small and which still provide all of the printed-circuit wiring required. In an attempt to solve this problem the baseboards are presently taking the form of multi-layers of printed circuit wiring with interconnection of the wiring in the different layers wherever required. It is not unusual to employ three or four layers of wiring with the number of wires per square inch extremely high. For example, a recently prepared multi-layer baseboard included 17 conductors in an area less than a square inch with each conductor being approximately 1/16 inch wide and capable of conducting 2 amperes of current. Baseboards of this type, if made transparent so that the wires of all layers are visible, have the appearance of solid metal in some areas.

Such high density of wiring, coupled with the need for accurate registration of interconnections between layers, practically demands the maintenance of a high degree of stability of the copper patterns on the different layers during the lamination process. Otherwise, there is a lack of registry or a failure to maintain consistency of relative positioning and spacing of interconnection points on the different layers. When thermosetting plastics such as phenolics are used as the bases, it is not too difficult to maintain registry. However, thermoplastics are characterized by many desirable characteristics such as transparency, flexibilty and unusually high resistivity to mention a few. When such thermoplastic bases are employed, there is a tendency for the thermoplastic base to flow when the temperature is raised to the point where it becomes plastic. These high temperatures are needed to facilitate the compression of the laminates into an integral unit. This flow tends to distort the copper patterns and makes registration and accurate relative positioning of the terminals on the different layers extremely difficult to control.

The present invention provides a solution for this flow problem. By means of the invention, lateral flow of the thermoplastic layers is minimized while desirable vertical flow for the purpose of bonding the layers to each other and in order to raise terminals on lower layers to the surface of the top layer is facilitated. The latter flowing or floating of the lower terminals to the surface of the top layer provides a single surface at the top layer at which all of the terminals are available and connections thereto can be effected by dip-soldering.

It is therefore an object of the present invention to provide a new and improved printed circuit baseboard of thermoplastic material in which the deficiencies and limitations of prior such baseboards are minimized.

It is a further object of the present invention to provide a new and improved printed circuit baseboard of thermoplastic material which has minimized lateral flow.

It is additionally an object of the present invention to provide a new and improved printed circuit baseboard of thermoplastic material which has many layers of printed conductors and extremely high wiring density maintained in stable wiring patterns.

In accordance with one form of the present invention, a multi-layer printed circuit baseboard comprises a plurality of thermoplastic supports each having a surface bonded to a surface of another support and each having a plurality of conductive members printed on the surface and arranged in accordance with predetermined wiring patterns. The conductive members include terminals for interconnection of the members on different ones of the supports. The upper ones of the supports include apertures exposing the terminals on the lower ones of the supports. Conductive means are provided for effecting the interconnection between terminals. The terminals are inserted from the lower side at the bottom one of the supports through pairs of the apertures. The supports are molded to cause the conductive means to be embedded in the bottom support and to cause the apertures to become substantially filled with the thermoplastic. This provides substantially smooth top and bottom surfaces.

In accordance with another form of the invention, there is provided a method of forming a multi-layer printed circuit baseboard. This method comprises selecting a plurality of thermoplastic supports each having a plurality of conductive members printed on a surface. These members have terminals for interconnection of the members on different ones of the supports and the supports for the upper layers of the baseboard have apertures for exposing those of the terminals on the lower ones of the supports. The selected thermoplastic supports are stacked in a predetermined order with a predetermined relative positioning of the members on different ones of the supports. Conductive means are inserted from the lower side of the bottom one of the supports through pairs of the apertures to effect the interconnection. Pressure is applied to the stack supports at a temperature at which the supports are plastic to cause the supports to adhere to each other and to cause the conductive means to become embedded in the bottom support. This in turn causes the aperture to become substantially filled with the thermoplastic.

For a better understanding of the present invention, together with other and further objects thereof, reference is made to the following description taken in connection with the accompanying drawings and its scope will be pointed out in the appended claims.

In the drawings:

Fig. 1 is an exploded diagram in perspective of a portion of a multi-layer baseboard in accordance with the present invention;

Figs. 2*a* and 2*b* represent a cross section of the baseboard of Fig. 1 before and after compression of the layers and indicating the manner of connection of U-shaped wire interconnection members;

*Description of multi-layer baseboard*

Figure 1:
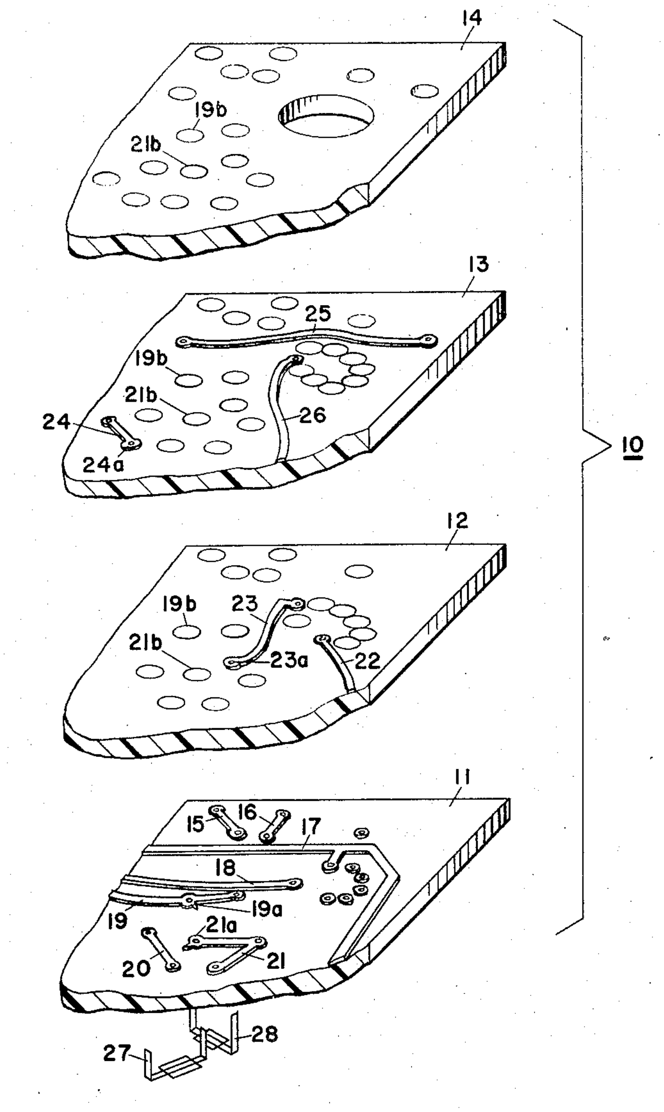

Referring now to the drawings and initially to Fig. 1 there is represented a four-layer baseboard 10, comprising a plurality of layers of thermoplastic insulating supports 11, 12, 13 and 14. Each of these supports is preferably of a transparent thermoplastic material, for example, Kel–F (tri-fluoro-chloro-ethylene) as manufactured by the M. W. Kellogg Company. While Kel–F is presently considered preferable, other thermoplastics may be used such as the polyvinyls, polyethylenes, polymethyl methacrylates, polystyrenes, fluorethenes including Teflon, trademark for poly-tetra-fluoro-ethylene as manufactured by E. I. du Pont de Nemours and Company, and polyvinyl acetates. However, in order to minimize lateral flow while retaining thickness each support can comprise a laminate of two layers of Kel–F separated by a layer of glass cloth such as Fiberglas. In the latter case the Kel–F layers are preferably of the order of .002 inch thick while the Fiberglas is .001 inch thick. When a pure Kel–F support is employed it preferably is of the order of .005 inch thick. A surface of each support is clad with a conductive material, such as copper, in the form of printed wiring. The copper is usually of the order of .00135 inch thick. The printed wiring may be affixed by any of a number of well-known processes, for example by conventional screening, electrodeposition or etching. Preferably, the wiring on the Kel–F layers 11–14, inclusive, is prepared in a manner more fully described in copending application Serial No. 459,841, entitled "Method of Bonding Copper to Tri-fluoro-chloro-ethylene."

As previously mentioned, each of the layers has a plurality of conductive members. These members are printed on non-contiguous surfaces of the layers and are arranged in accordance with predetermined wiring patterns. For example, the layer 11 has a number of conductors, more specifically conductors 15–21, inclusive. At least some of the conductors have terminals for interconnection of the members on different ones of the supports. Apertures are provided in the upper ones of the supports exposing the terminals on the lower supports. For example, the conductor 21 has a terminal **21*a* exposed by apertures 21*b* in the upper layers 12, 13 and 14, and similarly the conductor 19 has a terminal 19*a* exposed by apertures 19*b* in the same layers. The layer 12 has conductors 22 and 23, the layer 13 conductors 24–26, inclusive, while the layer 14 comprises an insulating cover plate, preferably of Kel–F, having no conductors mounted on the surface thereof. The apertures in the layers 12, 13 and 14 are designed to register with conductor terminals in the layer 11**. The conductive terminations are exposed by the apertures in order that connections may be soldered thereto. This exposure is obvious in Fig. 2*a*.

Figure 3:
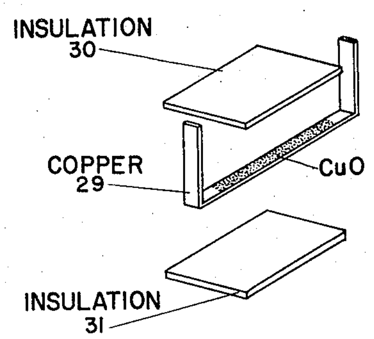
Fig. 3 is an exploded diagram of a U-shaped wire member.

The multi-layer baseboard 10 in accordance with the present invention also includes conductive means for effecting interconnections between terminals, for example, a plurality of U-shaped wire members individually inserted through the pairs of the apertures and individually affixed to pairs of the conductors to interconnect pairs of the conductors in different layers. Such U-shaped members are represented in Fig. 1 as members 27 and 28. One of these members is more fully represented in Fig. 3 where it is seen to include a flat strip of copper 29, preferably 1/16 inch wide and .004 inch thick, bent to assume a staple-like appearance. If it is desired to insulate the unbent section of the strip from other circuits this section may be covered by insulating pads such as the Kel–F members 30 and 31 in Fig. 3.

Considering again Fig. 1, the U-shaped member 27 is inserted through the layer 11, the layer 12, and the layer 13 to connect the termination **21*a* of the conductor 21 on the layer 11 with the termination 24*a* of the conductor 24 on the layer 13. U-shaped member 28 is inserted through the layers 11 and 12 to connect the termination 19*a* of the conductor 19 on the layer 11 with the termination 23*a* of the conductor 23 on the layer 12. It should be noticed that the conductor terminations to be interconnected by the U-shaped or staple-like members 27 and 28 are identified by small arrows formed in the terminations 19*a* and 21*a*. These arrows indicate that one end of a staple is to be connected to the termination indicated by the direction of the arrow. For example, after the layers are assembled, the arrow in the termination 21*a* points to the termination 24*a* and the arrow in the termination 19*a* points to the termination 23*a***. Preferably, these arrows are formed as part of the copper conductors during the etching process.

Figure 2A:
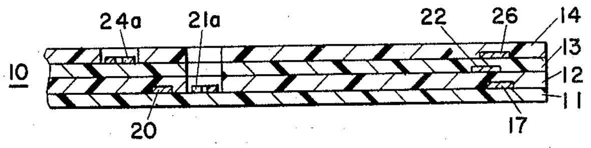
Figure 2B:
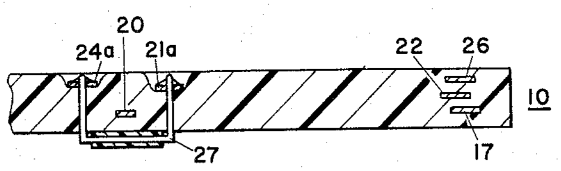

A cross section of the layers of supports combined to form the baseboard 10 and taken along the plane of the member 27 connecting the terminals **24*a* and 21*a*** is represented in Figs. 2*a* and 2*b*. The apertures in the layers 12, 13 and 14 to register with the terminal **21*a* and in the layer 14 to register with the terminal 24*a*** are easily visible in Fig. 2*a*. It is important to note, as represented in Fig. 2*b*, that during the lamination process when the layers 11–14, inclusive, become plastic, the pressure for compressing these layers into a unit forces the plastic material in the layer 11 to flow to fill the cavity formed over the terminal **21*a* by the apertures in the layers 12, 13 and 14. This causes the terminal 21*a*** to float to the top as shown in Fig. 2*b*. The vertical flow and rise of the terminal **21*a* is only of the order of a .015 inch and thus any slight distortion or pulling of the terminal 21*a*** is acceptable. There is a negligible lateral flow in the different layers during this process because the thickness of each thermoplastic layer is of the order of the thickness of the copper wiring. This results in the printed-circuit wiring acting as a binding agent inhibiting lateral flow. The layer of thermoplastic should be in the range of 2 to 5 times as thick as the copper.

If thicker layers are desired or further inhibiting of lateral flow is desired, each layer may be made up of layers of thermoplastic and glass cloth as previously described. In such case the glass cloth inhibits the lateral flow. On the other hand, the layers of Kel–F cannot be made too thin as enough plastic material is needed to effect complete bonding and sealing between layers by vertical flow and to float terminals to the top layer. The combination of glass cloth and thermoplastic material is characterized by a high degree of dimensional stability. By introducing a plurality of layers of such combinations, the degree of flexibility can be varied from flexible to relatively stiff. In Fig. 2*b* it is quite apparent that by utilizing the staple 27, the terminals **21*a* and 24*a* are simply and positively connected while the floating of all terminals on lower layers to the level of the top layer 14 facilitates dip-soldering of the upper surface of the layer 14 to secure the staple to the terminations 21*a* and 24*a***.

Figure 4:
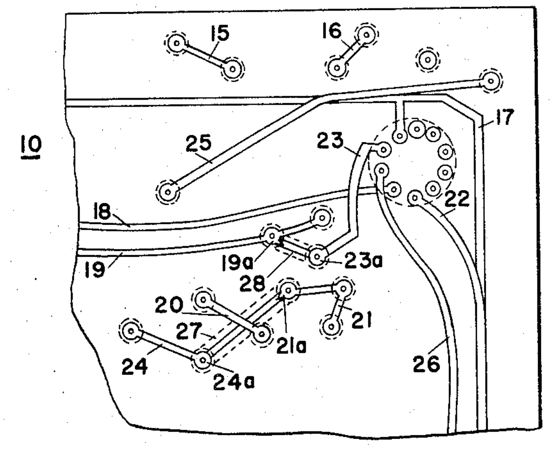
Fig. 4 is a plan view of the printed circuit layers of Fig. 1 assembled into a single baseboard.

Fig. 4 represents a top plan view of the composite baseboard with layers 11–14 registered with respect to each other and pressed into one solid laminated baseboard to provide a transparent member. As represented in Fig. 4, the relative relationships of the many conductors are apparent and the need for and manner of utilization of the staples 27 and 28 are also apparent. In viewing the section of the baseboard represented by Fig. 4, it should be understood that for ease of representation and simplicity of explanation only a few of the conductors that normally would appear in an area of this size are represented. Conventionally, many more conductors would be employed so that the area as represented by Fig. 4 would appear a solid mass of conductors. To obtain this result probably more than the four layers represented in Fig. 1 would be employed.

The multi-layer thermoplastic baseboard described above has many desirable features not available in prior baseboards. Among these are its lightweight, thinness, flexibility, transparency, high density of conductors, high dielectric strength and imperviousness to humidity. However, one of its most important features is the dimensional stability while the layers are compressed while in a plastic condition to form the baseboard. The facility of dip-soldering all connections by inserting only one face of the board into the solder bath and obtainable by the floating of lower terminals to this face is also important. The latter feature is obtainable by employing staple-type interconnecting conductors in the manner described above. These conductors provide the added advantages of placing all of the exposed conductors, that is, the unbent sections of the staples, on one surface of the composite baseboard while only soldering apertures appear in the other surface. By using staple-type conductors all connections made between conductors on different layers can be made after the baseboard is completely assembled. There is no need for inserting eyelets in each layer prior to assembling of the layers. Finally, the connections to be made can be easily and simply indicated in a transparent baseboard by forming indicia, such as small arrows, in the copper conductors during the etching process indicating a conductor terminal to be soldered to one end of a staple conductor and pointing out the direction and identification of the other conductor terminal to be soldered to the other end of the staple.

The description of many layers of insulating supports can create the impression that the assembled baseboard is quite thick and the apertures easily visible in the baseboard. These impressions should be dispelled. A completed board of four or five layers is approximately .010 to .040 inch thick and the apertures in the different layers tend to fill during the lamination of the layers, having depths in a finished baseboard of no more than a few thousandths of an inch. The finished baseboard normally has no appearance of having layers or apertures.

While there has been described what is at present considered to be the preferred embodiment of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A multi-layer printed circuit baseboard comprising: a plurality of thermoplastic supports each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports; conductive means for effecting said interconnections inserted from the lower side of the bottom one of said supports through pairs of said apertures; and said supports molded to cause said conductive means to be embedded in said bottom support and to cause said apertures to become substantially filled with said thermoplastic to provide substantially smooth top and bottom surfaces.

2. A multi-layer printed circuit baseboard comprising: a plurality of thermoplastic supports each having a surface bonded to a surface of another support without use of a bonding agent and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports; conductive means for effecting said interconnections inserted from the lower side of the bottom one of said supports through pairs of said apertures; and said supports molded to cause said conductive means to be embedded in said bottom support and to cause said apertures to become substantially filled with said thermoplastic to provide substantially smooth top and bottom surfaces.

3. A multi-layer printed circuit baseboard comprising: a plurality of tri-chloro-fluoro-ethylene supports each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports; conductive means for effecting said interconnections inserted from the lower side of the bottom one of said supports through pairs of said apertures; and said supports molded to cause said conductive means to be embedded in said bottom support and to cause said apertures to become substantially filled with said thermoplastic to provide substantially smooth top and bottom surfaces.

4. A multi-layer printed circuit baseboard comprising: a plurality of supports each comprising a laminate of thermoplastic and glass cloth, each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports; conductive means for effecting said interconnection inserted from the lower side of the bottom one of said supports through pairs of said apertures; and said supports molded to cause said conductive means to be embedded in said bottom support and to cause said apertures to become substantially filled with said thermoplastic to provide substantially smooth top and bottom surfaces.

5. A multi-layer printed circuit baseboard comprising: a plurality of thermoplastic supports each having a surface bonded to a surface of another support and each having a plurality of conductive members having a thickness in the range of one-half to one-fifth that of each of said supports printed on a surface and arranged in accordance with predetermined wiring patterns; terminals for said conductive members for interconnection of said members on different ones of said supports; apertures in the upper ones of said supports exposing those of said terminals on lower ones of said supports; conductive means for effecting said interconnections inserted from the lower side of the bottom one of said supports through pairs of said apertures; and said supports molded to cause said conductive means to be embedded in said bottom support and to cause said apertures to become substantially filled with said thermoplastic to provide substantially smooth top and bottom surfaces.

6. A multi-layer printed circuit baseboard comprising: a plurality of thermoplastic supports each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports and said terminals on said lower ones of said supports raised through said apertures to the level of a higher one of said supports by molding and flowing of the lower ones of said thermoplastic supports; conductive means for effecting said interconnections inserted from the lower side of the bottom one of said supports through pairs of said apertures.

7. A multi-layer printed circuit baseboard comprising: a plurality of thermoplastic supports each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports and said terminals on said lower ones of said supports raised through said apertures to the level of the top of said supports by deformation of said lower ones of said supports in the vicinity of said terminals thereon by molding and flowing of the lower ones of said thermoplastic supports; conductive means for effecting said interconnections inserted from the lower side of the bottom one of said supports through pairs of said apertures.

8. A multi-layer printed circuit baseboard comprising: a plurality of thermoplastic supports each having a surface bonded to a surface of another support and each having a plurality of conductive members printed on a surface and arranged in accordance with predetermined wiring patterns; terminals for said conductive members for interconnection of said members on different ones of said supports; apertures in the upper ones of said supports exposing those of said terminals on lower ones of said supports; U-shaped wire members inserted from the lower side of the bottom one of said supports through said apertures to interconnect said terminals for effecting said interconnection and said supports molded to cause said wire members to be embedded in said bottom support and to cause said apertures to become substantially filled with said thermoplastic to provide substantially smooth top and bottom surfaces.

9. The method of forming a multi-layer printed circuit baseboard comprising: selecting a plurality of thermoplastic supports each having a plurality of conductive members printed on a surface, said members having terminals for interconnection of those of said members on different ones of said supports, and those of said supports for upper layers of said baseboard having apertures for exposing those of said terminals on lower ones of said supports; stacking said supports in a predetermined order with predetermined relative positioning of said members on different ones of said supports; inserting conductive means from the lower side of the bottom one of said supports through pairs of said apertures to effect said interconnection; and applying pressure to said stacked supports at a temperature at which said supports are plastic to cause said supports to adhere to each other and to cause said conductive means to become embedded in said bottom support and to cause said apertures to become substantially filled with said thermoplastic to form a multi-layer support having substantially smooth top and bottom surfaces.

10. The method of forming a multi-layer printed circuit baseboard comprising: selecting a plurality of trichloro-fluoro-ethylene supports each having a plurality of conductive members printed on a surface, said members having terminals for interconnection of those of said members on different ones of said supports, and those of said supports for upper layers of said baseboard having apertures for exposing those of said terminals on lower ones of said supports; stacking said supports in a predetermined order with predetermined relative positioning of said members on different ones of said supports; inserting conductive means from the lower side of the bottom one of said supports through pairs of said apertures to effect said interconnection and applying pressure to said stacked supports at a temperature at which said supports are plastic to cause said supports to adhere to each other and to cause said conductive means to become embedded in said bottom support and to cause said apertures to become substantially filled with said thermoplastic to form a multi-layer support having substantially smooth top and bottom surfaces.

11. The method of forming a multi-layer printed circuit baseboard comprising: selecting a plurality of supports composed of layers of thermoplastic and fibrous material and each having a plurality of conductive members printed on a surface, said members having terminals for interconnection of those of said members on different ones of said supports, and those of said supports for upper layers of said baseboard having apertures for exposing those of said terminals on lower ones of said supports; stacking said supports in a predetermined order with predetermined relative positioning of said members on different ones of said supports; inserting conductive means from the lower side of the bottom one of said supports through pairs of said apertures to effect said interconnection; and applying pressure to said stacked supports at a temperature at which said supports are plastic to cause said supports to adhere to each other and to cause said conductive means to become embedded in said bottom support and to cause said apertures to become substantially filled with said thermoplastic to form a multi-layer support having substantially smooth top and bottom surfaces.

12. The method of forming a multi-layer printed circuit baseboard comprising: selecting a plurality of thermoplastic supports each having a plurality of conductive members of a thickness in the range of one-half to one-fifth that of a support printed on a surface, said members having terminals for interconnection of those of said members on different ones of said supports, and those of said supports for upper layers of said baseboard having apertures for exposing those of said terminals on lower ones of said supports; stacking said supports in a predetermined order with predetermined relative positioning of said members on different ones of said supports; inserting conductive means from the lower side of the bottom one of said supports through pairs of said apertures to effect said interconnection; and applying pressure to said stacked supports at a temperature at which said supports are plastic to cause said supports to adhere to each other and to cause said conductive means to become embedded in said bottom support and to cause said apertures to become substantially filled with said thermoplastic to form a multi-layer support having substantially smooth top and bottom surfaces.

13. The method of forming a multi-layer printed circuit baseboard comprising: selecting a plurality of thermoplastic supports each having a plurality of conductive members printed on a surface, said members having terminals for interconnection of those of said members on different ones of said supports, and those of said supports for upper layers of said baseboard having apertures for exposing those of said terminals on lower ones of said supports; stacking said supports in a predetermined order with predetermined relative lateral positioning of said members on different ones of said supports; inserting conductive means from the lower side of the bottom one of said supports through pairs of said apertures to effect said interconnection; and applying pressure to said stacked supports at a temperature a which said supports are plastic to cause said supports to adhere to each other to form a multi-layer support without substantial lateral movement of said conductive members thereby maintaining said relative positioning of said members, and to cause said terminals on lower ones of said supports to be raised through said apertures to higher levels by the flow of thermoplastic material under said lower terminals.

References Cited in the file of this patent

UNITED STATES PATENTS

| | | |
|---|---|---|
| 1,718,993 | Wermine | July 2, 1929 |
| 2,492,236 | Mydlil | Dec. 27, 1949 |
| 2,547,022 | Leno | Apr. 3, 1951 |
| 2,695,351 | Beck | Nov. 23, 1954 |